(12) United States Patent
Choi

(10) Patent No.: US 6,887,794 B2  
(45) Date of Patent: May 3, 2005

(54) PRE-CLEANING METHOD OF SUBSTRATE FOR SEMICONDUCTOR DEVICE

(75) Inventor: Kyu-Jin Choi, Seoul (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 10/331,794

(22) Filed: Dec. 30, 2002

(65) Prior Publication Data

US 2003/0129848 A1 Jul. 10, 2003

(30) Foreign Application Priority Data

Jan. 4, 2002 (KR) .................................. 10-2002-0000497

(51) Int. Cl.$^7$ ............................................. H01L 21/302
(52) U.S. Cl. ........................ 438/710; 438/723; 134/1.2
(58) Field of Search ................................. 438/706–744, 438/906; 134/1–1.3

(56) References Cited

U.S. PATENT DOCUMENTS

| | | | | |
|---|---|---|---|---|
| 5,114,529 A | * | 5/1992 | Masuyama et al. | ......... 438/725 |
| 5,510,277 A | * | 4/1996 | Cunningham et al. | ....... 438/707 |
| 6,050,217 A | * | 4/2000 | Li | ......................... 118/723 E |
| 6,068,729 A | * | 5/2000 | Shrotriya | ............... 156/345.26 |
| 6,162,323 A | * | 12/2000 | Koshimizu | ............. 156/345.26 |
| 6,192,828 B1 | * | 2/2001 | Takahashi et al. | ....... 118/723 E |
| 6,633,132 B2 | * | 10/2003 | Yoo | ....................... 315/111.21 |
| 2001/0001413 A1 | * | 5/2001 | Deornellas et al. | ......... 156/345 |

FOREIGN PATENT DOCUMENTS

| KR | 1997-0072053 | 11/1997 |
|---|---|---|
| KR | 1998-055742 | 9/1998 |

* cited by examiner

Primary Examiner—Savitri Mulpuri  
(74) Attorney, Agent, or Firm—Baker & Daniels

(57) ABSTRACT

A pre-cleaning method of a substrate for a semiconductor device includes preparing a chamber, the chamber including a plasma electrode at an outside of the chamber, a power supplying system connected to the plasma electrode, a susceptor in the chamber, and an injector injecting gases into the chamber, equipping a metallic net in the chamber, the metallic net over the susceptor and grounded, disposing a substrate on the susceptor, and injecting a hydrogen gas into the chamber through the injector and supplying radio frequency power to the plasma electrode, thereby removing an oxide layer on the substrate.

2 Claims, 2 Drawing Sheets

PRE-CLEANING METHOD OF SUBSTRATE FOR SEMICONDUCTOR DEVICE

This application claims the benefit of Korean Patent Application No. 2002-00497, filed on Jan. 4, 2002 in Korea, which is hereby incorporated by reference for all purposes as if fully set forth herein.

BACKGROUND OF THE INVENTION

1. Field of the Invention

The present invention has subject for removing natural oxide layer on the substrate with a metallic net, which draws hydrogen ions. Since the metallic net draws hydrogen ions, hydrogen radicals impact the substrate not the metallic net, thereby removing the natural oxide layer.

2. Discussion of the Related Art

Among manufacturing processes of a semiconductor device, in a growth process of a silicon epitaxial layer, which is carried out under a relatively low temperature, no matter how thin an oxide layer including impurities may be formed on a substrate for forming the silicon epitaxial layer, it is hard to get a high-quality epitaxial layer. This is why the oxide layer including impurities causes a defect such as dislocation and stacking fault. Therefore, a process of removing the oxide layer is a prerequisite for growth of the silicon expitaxial layer.

The process of removing the oxide layer includes two steps. In a first step, a semiconductor substrate including a natural oxide layer thereon is dipped into a hydrogen fluoride (HF) solution, thereby first wet-etching the natural oxide layer. And the semiconductor substrate is washed with de-ionized water to remove the HF solution on the natural oxide layer, and is dried in a spin drier or a drier using isopropyl alcohol. However, in the first step, another natural oxide layer of about 2 angstroms to about 6 angstroms may be formed on the semiconductor substrate again. Therefore, in a second step, the semiconductor substrate is in-situ pre-cleaned in a plasma apparatus for growing a silicon expitaxial layer, thereby removing the natural oxide layer.

FIG. 1 is a schematic view showing an apparatus for a related art in-situ pre-cleaning of a semiconductor substrate.

As shown in FIG. 1, a semiconductor substrate 130, which has a natural oxide layer thereon, is disposed on a susceptor 110 within a processing chamber 100. A plasma electrode 120 is situated on a bell jar that is the upper part of the processing chamber 100, and is connected to a power supplying system 125 to be supplied with electric power for generating plasma. At this time, the susceptor 110 is grounded, and a hydrogen gas ($H_2$) is provided in the processing chamber 100 through the gas injector 140. Plasma comprising hydrogen ions ($H^+$), electrons and radicals is generated from the hydrogen gas, and the hydrogen ions collide against the natural oxide layer on the semiconductor substrate 130, thereby removing the natural oxide layer. This process is referred to as a hydrogen plasma pre-cleaning process. Since the process is carried out under a low temperature, an excessive thermal budget is not caused contrary to a hydrogen baking process performed under a high temperature.

However, the semiconductor substrate may be damaged because of the hydrogen plasma pre-cleaning process depending on ion sputtering.

SUMMARY OF THE INVENTION

Accordingly, the present invention is directed to a pre-cleaning of a substrate for a semiconductor device that substantially obviates one or more of problems due to limitations and disadvantages of the related art.

An advantage of the present invention is to provide a pre-cleaning method of a substrate for a semiconductor device that removes a natural oxide layer and prevents the substrate from being damaged.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a pre-cleaning method of a substrate for a semiconductor device includes preparing a chamber, the chamber including a plasma electrode at an outside of the chamber, a power supplying system connected to the plasma electrode, a susceptor in the chamber, and an injector injecting gases into the chamber, equipping a metallic net in the chamber, the metallic net over the susceptor and grounded, disposing a substrate on the susceptor, and injecting a hydrogen gas into the chamber through the injector and supplying radio frequency power to the plasma electrode, thereby removing an oxide layer on the substrate.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, the example of which is illustrated in the accompanying drawings. Wherever possible, the same reference numbers will be used throughout the drawings to refer to the same or like parts.

Figure 1:
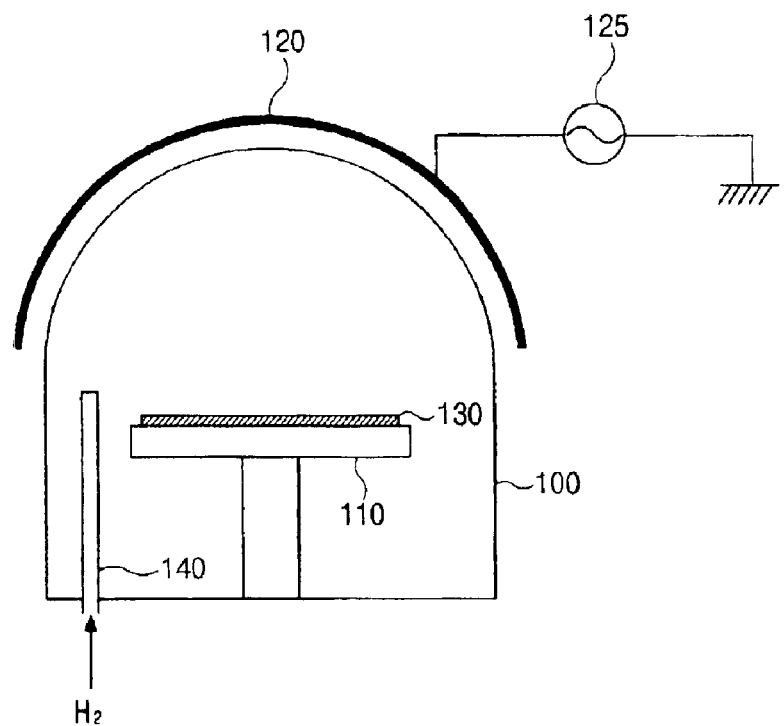
FIG. 1 is a schematic view showing an apparatus for a related art in-situ pre-cleaning of a semiconductor substrate.
Figure 2:
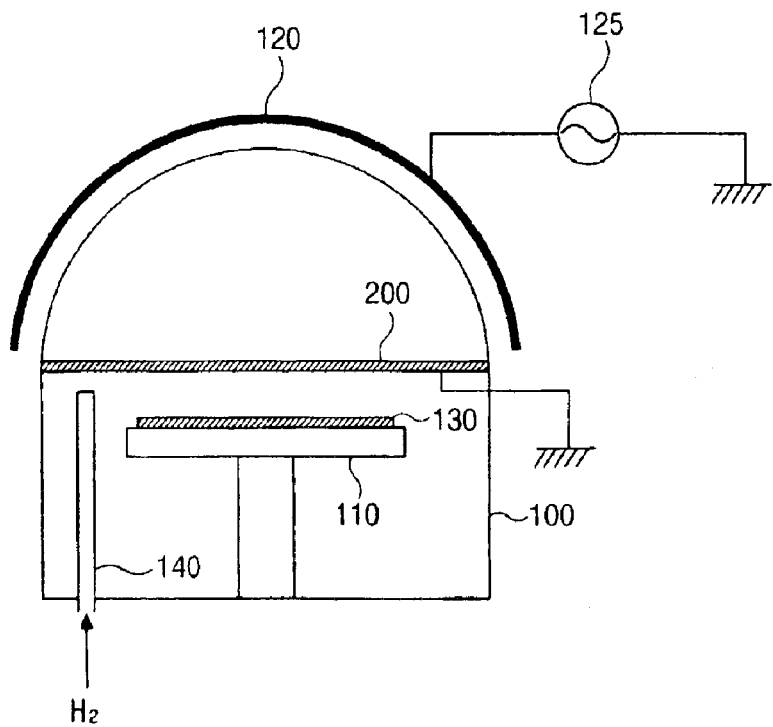
FIG. 2 is a schematic view showing an apparatus for a pre-cleaning of a semiconductor substrate according to the present invention.

FIG. 2 is a schematic view showing an apparatus for a pre-cleaning of a semiconductor substrate according to the present invention. In FIG. 2, a susceptor 110 is disposed in a processing chamber 100, and a semiconductor substrate 130 such as a silicon wafer is situated on the susceptor 110. A net 200 is located spacing apart over the susceptor 110, and is grounded. A mesh of the net 200 is within a range of about 0.1 mm to about 2 mm, and in the present invention, a one-millimeter mesh is used. Although not shown in the figure, the edge of the net 200 is connected to an O-ring and a ring structure, which are equipped in a chamber flange.

Figure 3:
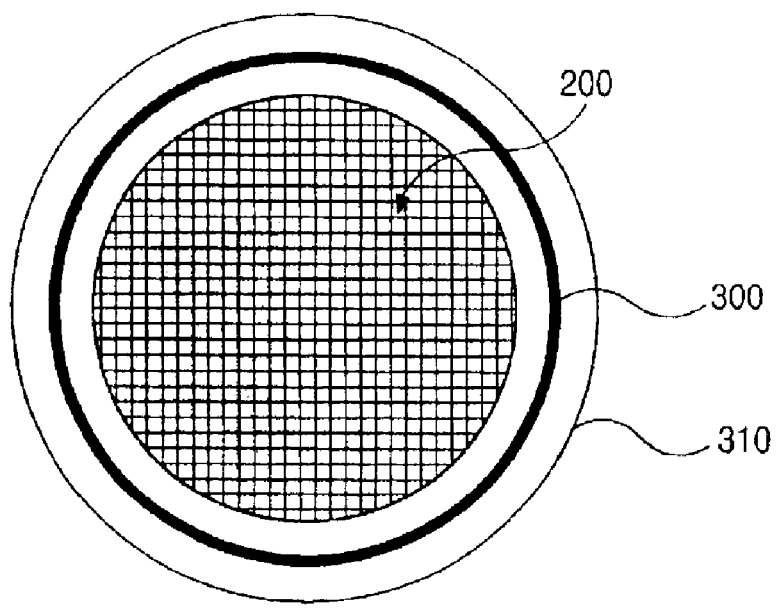
FIG. 3 is a view showing a ring structure for connection of a net in the present invention.

FIG. 3 shows the ring structure for connection of the net in the present invention. As shown in the drawing, the ring structure 310, which is combined with the chamber flange (not shown), has a first groove for inserting the O-ring 300 therein at the upper side, and the net 200 is disposed at the middle of the ring structure 310. The ring structure 310 has a second groove at the lower side. Next, the ring structure 310 is disposed on the chamber flange, contacting the O-ring 300 to the chamber flange. Another O-ring (not shown) is situated in the second groove of the ring structure 310, and a quartz dome, which is the upper part of the processing chamber 100 of FIG. 2, is equipped on the ring structure 310. The net 200 may have a circular shape.

In a pre-cleaning method of a substrate according to the present invention using the apparatus of FIGS. 2 and 3, hydrogen gases are supplied in the processing chamber 100 through an injector 140 and radio frequency (RF) power is provided to a plasma electrode 120 from a power supplying system 125. Then, hydrogen plasma comprising hydrogen ions, electrons and hydrogen radicals is generated, and the net 200 draws the hydrogen ions up to it, thereby colliding the hydrogen ions. On the other hand, hydrogen radicals included in the hydrogen plasma impact the semiconductor substrate 130, not colliding against the net 200, and remove the natural oxide layer.

Therefore, in the present invention, the natural oxide layer is removed without damage of the substrate, and a good silicon epitaxial layer can be grown.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A pre-cleaning method of a substrate for a semiconductor device, comprising:

preparing a chamber, including:
a plasma electrode at an outside of the chamber;
a power supplying system connected to the plasma electrode;
a susceptor in the chamber; and
an injector injecting gases into the chamber;
equipping a metallic net in the chamber, with the metallic net having a circular shape and a mesh of the metallic net having a size within a range of about 0.1 mm to about 2 mm, the metallic net over the susceptor and grounded
disposing a substrate on the susceptor;
injecting a hydrogen gas into the chamber through the injector and supplying radio frequency power to the plasma electrode, thereby generating hydrogen ions and hydrogen radicals; and
drawing the hydrogen ions to the metallic net and impacting the substrate with hydrogen radicals, thereby removing an oxide layer on the substrate.

2. The method according to claim 1, wherein the metallic net is parallel to the substrate.

* * * * *